United States Patent [19]

Ovshinsky et al.

[11] Patent Number: 4,788,594
[45] Date of Patent: Nov. 29, 1988

[54] SOLID STATE ELECTRONIC CAMERA INCLUDING THIN FILM MATRIX OF PHOTOSENSORS

[75] Inventors: Stanford R. Ovshinsky, Bloomfield Hills; Lawrence G. Norris, West Bloomfield, both of Mich.

[73] Assignee: Energy Conversion Devices, Inc., Troy, Mich.

[21] Appl. No.: 918,952

[22] Filed: Oct. 15, 1986

[51] Int. Cl.⁴ .............................................. H04N 3/14
[52] U.S. Cl. ................................ 358/213.13; 358/213.11
[58] Field of Search ............ 358/294, 213.11, 213.23, 358/213.27, 213.28, 213.31, 909, 213.13; 250/578

[56] References Cited

U.S. PATENT DOCUMENTS 4,303,322 12/1981 Someya ............................. 358/909
4,541,016 9/1985 Ochi et al. ........................... 358/909
4,607,168 8/1986 Oritsuki et al. ................. 358/213.11
4,660,095 4/1987 Cannella et al. ..................... 358/294
4,677,289 6/1987 Nozaki et al. ....................... 250/578

Primary Examiner—Jin F. Ng
Assistant Examiner—Stephen Brinich
Attorney, Agent, or Firm—Marvin S. Siskind; Ronald W. Citkowski

[57] ABSTRACT

A thin film photosensor array for an electronic camera, said array adapted to provide an electrical signal corresponding to an image projected thereon. The photosensor array is preferably fabricated as a large area matrix of thin film, small area photosensitive elements capable of providing high resolution output in response to input from conventional camera optical systems. The photosensor array can be specifically tailored to provide color output or particular spectral sensitivity.

31 Claims, 3 Drawing Sheets

SOLID STATE ELECTRONIC CAMERA INCLUDING THIN FILM MATRIX OF PHOTOSENSORS

FIELD OF THE INVENTION

This invention relates generally to photography and photographic apparatus and, more particularly, to electronic cameras which include therein a large area thin film photosensor array and which are adapted to provide high resolution images.

BACKGROUND OF THE INVENTION

Photographic technology has enjoyed an ever increasing growth since its inception more that 150 years ago. What began as a curiosity which required long exposure times to produce low quality image reproductions has advanced to become a large and diverse technology having widespread utility for both commercial and recreational purposes.

Photography has, until recently, been a process based upon chemical reactions, typically of photosensitive salts of precious metals such as silver and platinum. While such processes have been optimized to provide high sensitivity, good resolution and reliable performance, they suffer from several shortcomings. Chemical based photographic systems consume relatively large amounts of both precious metals and specially synthesized organic chemicals; consequently chemical processes tend to be fairly expensive. Furthermore, chemical processes require fairly strict control of time and temperature conditions in order to produce uniformly reliable results. Additionally, chemical based photographic systems require the storage and deployment of relatively large amounts of photographic film within a camera, and necessitate, in most instances, complex processing equipment.

Because of the foregoing limitations of chemical photographic systems, the industry has explored the possibility of adapting presently emerging electronic imaging technologies to photographic systems. Image scanners are enjoying growing utility in a variety of products and for a diversity of applications such as television cameras, input of alpha numeric data to computers and the like and machine vision systems. Optical scanning systems typically include one or more photosensor arrays, each array including a plurality of photoresponsive elements. For purposes of describing the present invention the term "photoresponsive element" shall be broadly applied to include any element capable of producing a detectable electronic signal in response to the absorption of illumination incident thereupon. By way of example, such detectable signals may be provided by a detectable change in voltage, current, resistivity, capacitance or the like.

Electronic photosensor arrays are capable of providing a signal corresponding to a pattern of information projected thereupon an consequently may be utilized in place of conventional photographic film to provide an electronic imaging system free of the shortcomings inherent in chemical based photographic systems.

Charge Coupled Devices (CCDs) are one type of photosensor array which have heretofore been employed in electronic photographic applications. CCDs are solid state devices, typically formed from single crystal silicon and which include therein an array of photoresponsive elements. CCDs have a high degree of photosensitivity and are capable of providing high resolution images. However, CCDs are relatively small in size; the typical CCD array is a two dimensional matrix approximately one centimeter square, and the largest CCDs currently produced are one dimensional arrays no greater than approximately 3 to 4 inches in length. These size constraints impose restrictions on the utility of CCDs for electronic photographic applications. While CCDs generally provide fairly high resolution, the fact that in a camera having practical utility, an optical system must be utilized to project a reduced size image of the object being photographed onto the surface of the CCD effectively reduce the resolution of the CCD.

The optical system itself degrades image resolution somewhat, but, the actual reduction process is the factor which most severely degrades the effective resolution of the image formed by a CCD. For example, a typical two dimensional CCD array is one centimeter square and includes therein 256,000 photosensor units, generally referred to as pixels. To translate this into photographic terminology, the equivalent resolution would be about 50 lines/mm for the one centimeter square CCD array. When an image or other pattern of information occupying an area of 35×35 millimeters is projected onto this one centimeter square charge coupled device, the effective resolution of the 35 millimeter square image is reduced to approximately 15 lines/mm. For the sake of comparison, medium resolution photographic film is generally capable of resolving approximately 120 lines/mm. Efforts to improve resolution using single crystal integrated circuits, such as CCDs, encounter at least two significant problems. The first is that integrated circuit chips formed on single crystal silicon wafers must be as small as possible to provide acceptable yields and to meet requirements of economical manufacturing. The second problem, which is intimately related to the first, is that in order to increase the packing density of elements in the small available chip area, finer and finer photolithography must be used with resulting increases in the cost of manufacture. For these reasons, among others, high resolution electronic photography (high resolution being defined relative to chemical photographic capabilities) utilizing present CCD technology is not economically achievable. A direct analogy would be that employing conventional CCD technology in a camera is akin to taking photographs on high grain (50 lines/mm) photographic film, utilizing a format which provides negatives 1 centimeter square. It is simply not possible to obtain good quality enlargements from such a combination.

With improvements in lithographic techniques, it is anticipated that one centimeter square CCDs may ultimately be fabricated to include 1.4 million pixels therein. This translates to a resolution of approximately 120 lines/mm on the one centimeter square device and a corresponding effective resolution of 34 lines/mm for a 35 millimeter square pattern of information projected thereonto. The only way the resolution of the CCD could be further increased is by increasing either the density of pixels in the CCD or the size of the device itself. Both approaches present significant problems. On one hand, the diffraction limit of light will ultimately impose limits on any photolithographic process utilized to pattern CCDs, although constraints of practicality and cost will generally intervene first to set an economic limit on pixel density. On the other hand, processing constraints will limit the size of crystalline CCDs that can be manufactured. Single crystal wafers cannot generally be economically manufactured in sizes exceeding perhaps six to eight inches in diameter. Furthermore, processing steps can introduce defects into such devices.

Increasing the size of a crystalline device, especially while maintaining strict limits on the size of the photolithographic features thereof imposes a great burden of cost insofar as the likelihood of creating defects exponentially increases along with a dramatic decrease in the yield of devices. The result is that the cost of the finished product increases exponentially with increasing device size. It will thus be appreciated that even utilizing the most optimistically projected pixel densities and single crystalline CCD sizes, electronic cameras capable of providing reasonably high resolution photographs of a practical size cannot be economically manufactured utilizing such technology.

Deposited thin film devices represent another approach to the fabrication of photosensor arrays for electronic photography. Thin film devices may be economically manufactured over large areas by the vapor deposition of successive layers of appropriately selected semiconductor alloy materials onto a variety of substrates. By patterning these layers, as for example, through the use of presently available photolithographic techniques, a variety of high resolution device configurations may be provided. It is toward the object of obtaining high resolution electronic images utilizing such large area arrays of thin film photosensitive elements that the instant invention is directed.

Recently, considerable progress has been made in developing processes for depositing thin film semiconductor materials. Such materials can be deposited to cover relatively large areas and can be doped to form p-type and n-type semiconductor materials for the production of semiconductor devices such as p-i-n type photodiodes equivalent, and in some cases superior to those produced by their crystalline counterparts. One particularly promising group of thin film materials are the amorphous materials. As usd herein, the term "amorphous" includes all materials or alloys which have long range disorder although they may have short or intermediate range order, or even contain at times, crystalline inclusions. Also as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur.

It is now possible to prepare by glow discharge, or other vapor deposition processes, thin film amorphous silicon, germanium or silicon-germanium alloys in large areas, said alloys possessing low concentrations of localized states in the energy gap thereof and high quality electronic properties. Techniques for the preparation of such alloys are fully described in U.S. Pat. Nos. 4,226,898 and 4,217,374 of Stanford R. Ovshinsky, et al., both of which are entitled "Amorphous Semiconductor Equivalent to Crystalline Semiconductors" and in U.S. Pat. Nos. 4,504,518 and 4,517,223 of Stanford R. Ovshinsky, et al., both of which are entitled "Method of Making Amorphous Semiconductor Alloys and Devices Using Microwave Energy"; the disclosures of all of the foregoing patents are incorporated herein by reference

SUMMARY OF THE INVENTION

Thin film semiconductor alloys may be readily manufactured to cover large areas by mass production processes and therefore provide for the economic fabrication of large scale photosensor arrays. The use of such large arrays effectively increases the "negative" size in a photographic process, thereby permitting the generation of high quality (high resolution, high sensitivity) photographs. Additionally, thin film photosensor arrays may be manufactured in a wide variety of sizes, thus permitting them to function as a direct replacement analog of photographic film. In this manner, a conventional camera may be converted to an electronic camera by the simple expedient of installing the appropriate thin film photosensor array, without the need for changing the optical system thereof If a thin film photosensor array is fabricated having a 50 micron pitch, that is to say 50 microns center-to-center spacing between the adjacent photosensitive elements thereof, the array will provide a resolution of 20 lines/mm. Since the array may be made larger than the 1 $cm^2$ CCD, its effective resolution will be higher than that of the CCD. For example, if the array of thin film photosensitive elements is 35 mm square, the resolution thereof will be better than that attainable when scanning a 35 millimeter square pattern of information with presently available CCDs. At the present point in time, a fifty micron pitch is readily achieved at very high yields utilizing conventional photolithographic techniques. If the pitch remained the same and a photosensor array of approximately 54 millimeters on an edge were fabricated, a 1.4 million pixel array would be realized.

Such arrays can be readily fabricated in 4"×5" and 8"×10" formats. Thus, it may be seen that by increasing the size of the photosensor array, and with presently available processing techniques, high resolution electronic photography is practical. Since thin film photosensor arrays can be made in sizes up to several feet, even assuming no new advances in said technology, the image resolving power of charge coupled devices can be exceeded by orders of magnitude with such thin film arrays.

Even though the foregoing discussion has been based upon the use of a 50 micron pitch, it is currently possible to fabricate thin film photosensor arrays characterized by a 29 micron pitch (or better). The use of a 29 micron pitch will increase the total number of pixels of the aforementioned 35 millimeter square array to 1.4 million. Obviously, by utilizing still larger arrays, even higher resolutions may be achieved. Techniques for the fabrication of two dimensional photosensor arrays are found in commonly assigned U.S. patent application No. 607,153 entitled "Contact Type Document Scanner And Method", filed May 4, 1984, now U.S. Pat. No. 4,660,095, the disclosure of which is incorporated herein by reference.

In addition to the use of two dimensional arrays, as described in the foregoing paragraph, the principles of the instant invention may be similarly employed in conjunction with linear photosensor arrays. Sensing a pattern of information may be accomplished with a linear array of photosensitive elements by scanning, or passing that array across the pattern of information. It is presently possible to fabricate linear photosensor arrays in sizes exceeding several meters. The use of such arrays in an electronic camera provides for ultra-high resolution imaging (UHRI). Techniques for the fabrication of such large arrays are found in U.S. patent application Ser. No. 885,907, now U.S. Pat. No. 4,725,889, filed July 15, 1986, and entitled "Photosensitive Line Imager Utilizing A Movable Scanning Arm", the disclosure of which is incorporated herein by reference. As described in the foregoing references, it is possible to design thin film photosensor arrays having gray scale and color sensitivity capabilities and by utilizing such capabilities, full color, high resolution images may be readily reproduced.

It may be seen that the instant invention eliminates constraints heretofore present in electronic cameras utilizing charge coupled or similar integrated circuits fabricated on single crystal wafers. The present invention thus makes possible high resolution electronic photographic systems which are characterized by ease and economy of fabrication.

These and other advantages of the instant invention will be apparent to those skilled in the art from the brief description of the invention, the drawings, the detailed description of the drawings and the claims which follow.

There is disclosed herein an electronic camera which includes a thin film photosensor array adapted to read a pattern of information incident thereon and provide an electrical signal corresponding thereto as well as optical means adapted to project a pattern of information corresponding to an object onto the photosensor array, and means for triggering the reading of the pattern of information by the photosensor array. The photosensor array may include a plurality of photoresponsive elements, each of which is adapted to produce an electrical signal in response to the illumination thereof and includes at least one layer of a semiconductor material chosen from the group consisting essentially of: amorphous silicon alloy materials, amorphous germanium alloy materials, and amorphous silicon germanium alloy materials. The photoresponsive element may comprise photodiodes, phototransistors, photoresistors, photovoltaic devices, and various combinations thereof.

In one embodiment, the photoresponsive elements are photodiodes which include therein two oppositely layers of the semiconductor material. In yet another preferred embodiment, the photodiodes include a layer of substantially intrinsic semiconductor material interposed between oppositely doped semiconductor layers so as to form a p-i-n type photodiode. The thin film photosensor array may further include addressing means for accessing each of the plurality of photoresponsive elements. The addressing means may include a plurality of electrically conductive lines arranged so as to form an x-y matrix; and, may further include a blocking element associated with each photoresponsive element, said blocking element and said address lines cooperating to provide for electrical communication with preselected ones of said photoresponsive elements. The blocking elements may be chosen from the group consisting essentially of diodes, transistors, resistors, threshold switches, relays and combinations thereof. The blocking element may, for example, comprise a p-i-n type diode. In some instances the address means may be integrated onto a single substrate with the remainder of the sensor array, whereas in other instances the address circuitry may be separately disposed.

In one preferred embodiment, the thin film photosensor array is a square array at least 35 mm on a side. Such an array may have a resolution of at least 20 lines/mm.

In another embodiment, the photosensor array is a square at least 5.7 cm on a side and includes therein at least 1.4 million photoresponsive elements.

In accord with the present invention, it is possible to provide a camera having color sensitivity by providing an array including at least two groups of photoresponsive elements, each group sensitive to a different portion of the electromagnetic spectrum, said groups cooperating to provide an electrical signal corresponding to the color values of the image projected thereonto. The groups may include an optical filter for providing color sensitivity, or in another embodiment, the groups may include therein semiconductor materials having a band gap optimized to provide sensitivity to different portions of the electromagnetic spectrum.

The thin film photosensor array may be a two dimensional or a linear array. The optical means may include a lens, and may further include a shutter adapted to control the length of time which the image is projected onto the array. Similarly, the optical means may further include means for controlling the intensity of the image projected onto the array. The trigger means may comprise mechanical means adapted to initiate reading by the array, or the trigger may include electrical means such as address circuitry for initiating reading.

In one embodiment, the photosensor array is a detachable element adapted to be mounted in the camera at the focal plane of the optical means. In other embodiments, the photosensor array forms a portion of the back of the camera. The camera of the instant invention may further include a video display terminal adapted to receive the electrical signal from the array and provide a visual display. The camera may further include a printer adapted to receive the signal and provide a hard copy. Storage means may also be included in the camera for storing the electrical signal provided by the sensor array; and, the camera may further include data processing means for electronically processing the signal provided by the array.

DETAILED DESCRIPTION OF THE DRAWINGS

Figure 1:
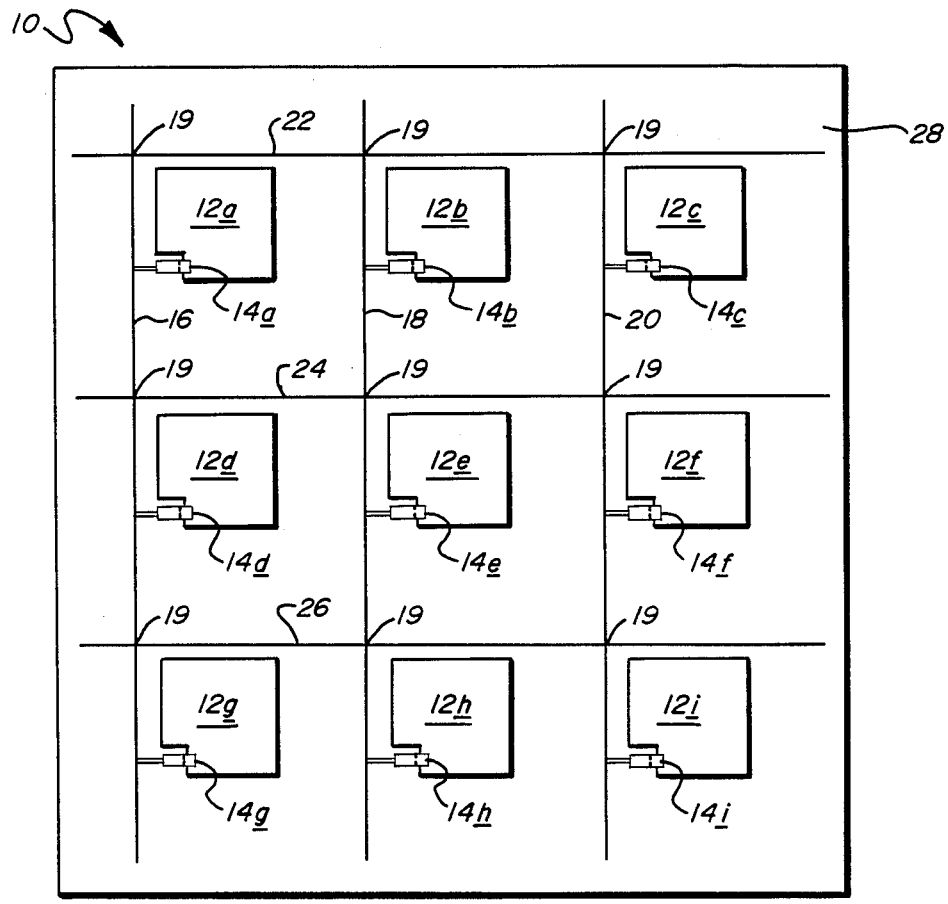
FIG. 1 is a top plan view of one particular type of thin film photosensor array which may be utilized in the practice of the instant invention.

Referring now to FIG. 1, there is shown in top plan view one particular thin film photosensor array 10, typical of those which may be utilized in the practice of the present invention. It is to be kept in mind that other (1xm and nx1) photosensor arrays may be similarly employed.

The photosensor array 10 is comprised of a plurality of photosensitive elements 12a–12i arrayed in a two-dimensional matrix form Each of the photosensitive elements, 12a–12i, has associated therewith an isolation device 14a–14i interconnecting that element 12 to a grid of address lines. As illustrated, the grid includes a plurality of X address lines 16, 18 and 20 and a plurality of Y address lines 22, 24 and 26, formed of an electrically conductive material such as a metal or the like.

The photosensor array 10 is formed upon a substrate 28, which may be a rigid member such as a glass, or metallic plate, or a flexible member such as a thin metallic body, or a sheet of synthetic polymeric material. In those instances where the substrate 28 is electrically conductive, it may be desirable to provide an insulating coating thereatop prior to the deposition of the address lines thereon The photosensor elements 12a–12i are photoresponsive elements, that is to say they are adapted to produce a detectable signal in response to the absorption of illumination. This signal may comprise a current, a voltage, a change in resistivity or the like. Among devices which may be utilized as photosensors 12, are photodiodes, phototransistors, photoconductive devices, photovoltaic devices and the like taken either singly or in combination. One group of photosensor devices having particular utility are p-i-n photovoltaic devices comprised of two oppositely doped layers of semiconductor material having a body of substantially intrinsic semiconductor material therebetween. Such devices may be used either singly or in stacked tandem combinations to produce voltage and/or current in response to the absorption of illumination.

The isolation device 14, associated with each of the photosensor elements is utilized to restrict the flow of electrical current through the photosensor array 10 to predetermined paths so as to facilitate addressing of particular photosensor elements 12. The isolation device 14 may comprise any type of control device such as a diode, a transistor, a threshold switch, a relay or the like. P-I-N type diodes have been found to be particularly useful in the fabrication of photosensor arrays.

The address lines 16, 18, 20, 22, 24 and 26 are arrayed in a X-Y matrix and electrically isolated at cross-over points 19. By addressing particular pairs of address lines, distinct photosensors may be accessed. For example, by addressing line 24 and line 18 sensor 12e is accessed. The presence of the blocking devices 14 on adjoining elements prevents the communication of unwanted electrical signals during addressing.

While a very wide variety of materials may be adapted to fabricate sensor arrays having utility in the instant invention, it has been found particularly advantageous to utilize thin film semiconductor alloy materials chosen from the group consisting essentially of amorphous silicon alloy materials, amorphous germanium alloy materials and amorphous silicon germanium alloy materials. Such materials may be readily formed into large size photosensor arrays. As utilized herein, the term amorphous silicon alloy materials refers to those alloys of silicon with other elements or materials as for example, compensating or modifying elements such as hydrogen, halogens, carbon and/or nitrogen. Similarly, the term germanium alloy materials shall refer to germanium in combination with other elements or materials. The term amorphous silicon germanium alloy shall include all alloys which include both silicon and germanium in any proportion with or without other elements or materials.

The array 10 may be made color responsive, that is to say, it may be constructed so as to provide an electronic signal having information relative to the wavelength of light incident thereupon. Such techniques are known to those skilled in the art and are disclosed in the patents and applications referred to hereinabove.

The photoresponsive elements 12 may be divided into a plurality of groups, and each group provided with an appropriate optical filter to enable it to "see" only particular wavelengths. Such filters may be integral with the elements 12, or may be external and separated therefrom. Alternatively, the entire array may be sequentially exposed through a plurality of filters so as to create color separation images which can be combined to provide a full color output.

In another approach to color sensitivity the semiconductor alloys of the photoresponsive elements may have their band-gaps adjusted by addition of appropriate elements so as to make the individual elements sensitive to particular portions of the electromagnetic spectrum. Such techniques will be found for example, in U.S. Pat. No. 4,342,044 of Ovshinsky, et al, entitled "Method for Optimizing Photoresponsive Amorphous Alloys and Devices," the disclosure of which is incorporated herein by reference.

It will be apparent to one of skill in the arts that while the photosensor array 10 of FIG. 1 is depicted as being a two dimensional matrix comprised of nine photosensor elements, in practicality an array comprised of a much larger number of elements will generally be preferred. It will also be apparent that while the array 10 of FIG. 1 is depicted as being a two dimensional array similar technology may be readily modified to provide a one dimensional, i.e. linear, array. Detailed descriptions of the operations and fabrication of both one and two dimensional sensor arrays will be found in the patents referred to and incorporated by reference hereinabove.

It should be appreciated that the photosensor array, such as the array 10 of FIG. 1 is a direct analog of a photographic film. As such, the sensor array may be incorporated into a camera to provide for electronic photography. The following drawings will be illustrative of various embodiments of camera utilizing thin film photosensor arrays, it being kept in mind that many other such systems will be readily apparent to one of skill in the photographic arts.

Figure 2:
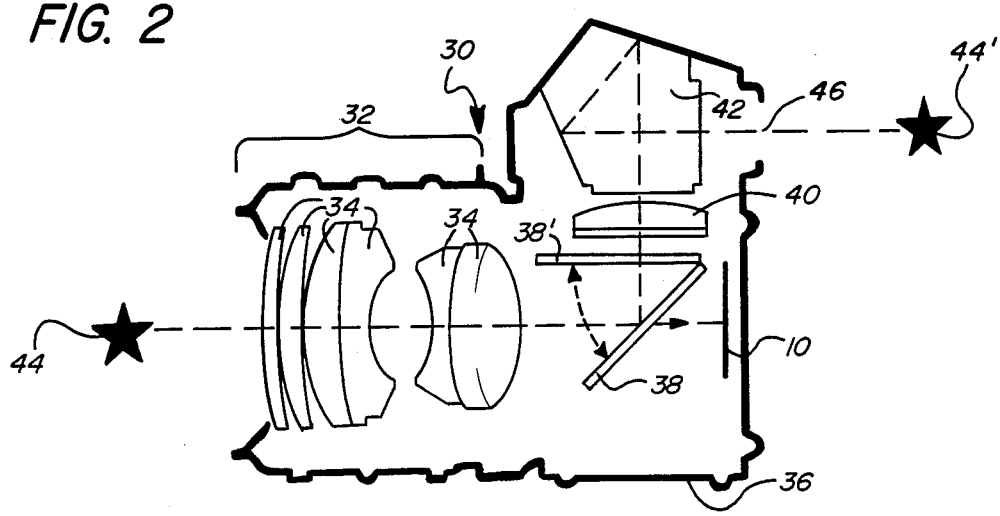
FIG. 2 is a cross sectional view of a single lens reflex camera as modified in accord with the principles of the instant invention.

Referring now to FIG. 2, there is shown in cross-sectional view a single lens reflex camera 30 as modified to include a photosensor array 10 therein. The camera 30, includes a lens assembly 32 comprised of a plurality of lens elements 34. The camera further includes a body 36 which houses the photosensor array 10, a mirror 38, a viewfinder lens 40 and a pentaprism 42.

The lens assembly 32 gathers light from an object being imaged (in this case the star 44), projects that light into the camera body 36 and onto the mirror 38. The mirror 38 reflects the light through the viewfinder lens 40 into the pentaprism 42 which redirects the light through a viewfinder aperture 46 so as to provide an image 44' of the object being photographed. This enables the photographer to compose the picture prior to the taking thereof. When a photograph is to be made, the mirror 38 swings to an upright position 38' to allow the light from the object 44 to strike the sensor array 10. Although not illustrated, the camera 30 may also include a shutter mechanism to control the duration of light falling upon the photosensor 10 and an iris or other light control means to regulate the intensity of light incident upon the sensor array 10.

The photosensor array 10 provides an electrical signal corresponding to the image projected thereupon. This signal may then be utilized to recreate a visual reconstruction of the object being photographed. Although not illustrated, the electrical signal provided by the photosensor 10 may be conveyed to a printer or video display terminal for reproduction of the image. Additionally, the electrical signal may be conveyed to a storage device such as a magnetic, optical, semiconductor or bubble memory for storage and later playback. Additionally, electronic image processing may be utilized to enhance, augment, or otherwise modify the photograph of the object in accord with well known image processing techniques.

Although not illustrated, the camera of 30 of FIG. 2 may include various of the aforementioned elements within its body. For example, storage media may be housed within the camera body so as to permit portable operation. It is anticipated that storage media may be manufactured in cassette form analogous to roll film and such cassettes may be plugged into and removed from the camera 30 for later playback or editing.

As mentioned previously, the photosensor array 10 is generally analogous to a photographic film and as such may be adapted to be removably affixed to the camera body 36. For example, the photosensor array 10 may be a direct substitute for photographic film, in which case it may be affixed to a conventional camera so as to convert that camera to an electronic camera. Other than affixing of the array, the only other modification necessary would be to establish provision for electrical connection to the array. In other instances, the camera body 36 may be specifically manufactured to include a photosensor array 10 therein. By proper choice of array size and camera body configuration, lenses from conventional cameras may be similarly utilized with electronic cameras.

An electronic camera may be provided with a plurality of photosensor arrays 10 having different photographic properties. For example, arrays may be fabricated to have enhanced ultraviolet or infrared sensitivity for particular imaging applications, likewise arrays may be manufactured to have higher or lower resolution or higher or lower photosensitivity to enable them to be used for a variety of purposes. Obviously, many modifications to the electronic photographic system herein described may be implemented. For example, a turret or cassette housing a plurality of different photosensor arrays may be utilized to enable the camera to adapt to a variety of conditions.

Figure 3:
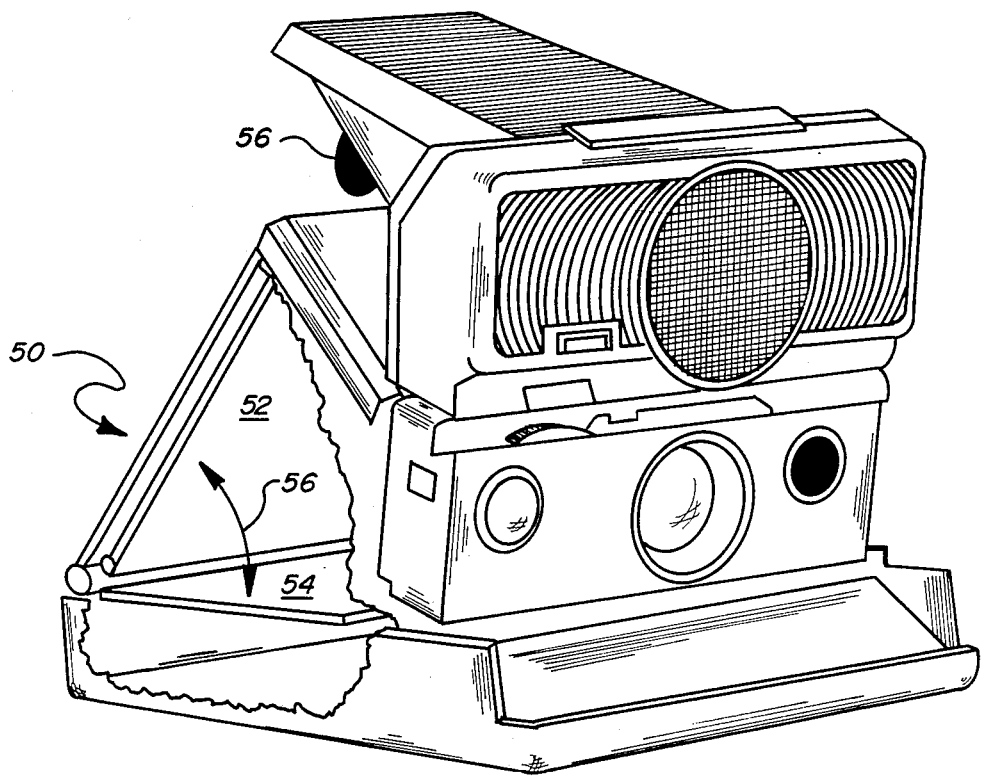
FIG. 3 is a cut away perspective view of a folding camera as modified in accord with the principles of the instant invention.

Referring now to FIG. 3 there is illustrated another embodiment of camera 50 as modified in accord with the instant invention so as to provide for electronic imaging. The camera 50 of FIG. 3 is a folding reflex camera generally similar to those employed for instant photography. As illustrated the camera includes a mirror 52 disposed on the backside thereof and adapted to reflect an image incident theeupon to a lower mirror 54, from which mirror the image is viewed through a viewfinder 56 when a photograph is to be taken, the lower mirror 54 is swung upward as indicated by the arrow 56 so as to lie atop the upper mirror 52. This allows the image to fall on the back surface of the lower mirror 54 which has a photosensor array disposed thereupon.

Obviously, other modifications are possible. For example, the back surface of the lower mirror 54 may also be reflective and the photosensor array may be disposed in the same plane as the lower mirror 54 is before it is deployed upward.

Figure 4:
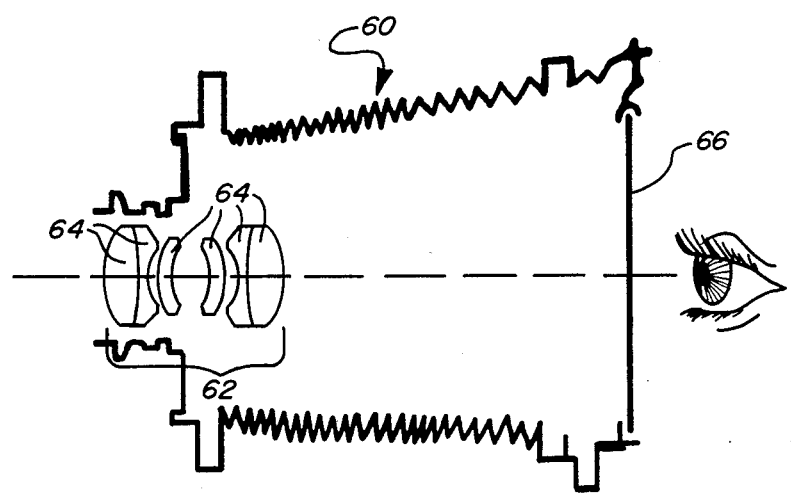
FIG. 4 is a cut away view of a view camera as modified in accord with the principles of the instant invention.

Referring now to FIG. 4 there is shown yet another camera embodiment of the instant invention. FIG. 4 illustrates in cutaway for, a view camera 60. Such cameras are widely used by professional photographers. View cameras include a lens array 62 comprised of a plurality of lens elements 64 disposed so as to project an image upon a ground glass viewing plate 66 for purposes of focusing and composition. The typical view camera is provided with one or more removable film cassettes, not shown here, adapted to hold a relatively large piece of photographic film, typically 4×5 or 8×10 inches in size. After the photograph is composed in the ground glass viewing plate 66, the film cassette is inserted into the camera in the same plane and an exposure is made. A view camera is particularly amenable to modification for electronic imaging because a cassette including a photosensor element may be readily inserted therein. In this manner, conventionally available cameras may be utilized for electronic imaging with no substantial modification.

In some cases, photographers may still find it desirable to utilize photochemically sensitive films. In such instances, an electronic image may be utilized to adjust the lighting, composition, etc., prior to actual exposure of a chemical photographic film. For example, a view camera such as the camera 60 of FIG. 4 may have a thin film photosensor array inserted in a casette thereof, the output of such array connected to a video display terminal. Composition and lighting may then be adjusted so as to produce a desired visual effect as observed on the terminal and once the appropriate effect is obtained, exposure may then be calculated by numerical computation based upon the output signal of the photosensor array. Once composition and exposure data are attained, the electronic photosensor array is removed and a chemical film inserted for exposure.

While the invention has been described with reference to image-wise utilization of a signal produced by a thin film photosensor, such will not always be the case. For example, it may not be desirable to display an electronically reconstructed image; however, a photographer may wish to use data obtained therefrom to calculate exposure times as mentioned with reference to the foregoing figure. Thin film photosensor arrays may effectively function as a light meter. Since the arrays are configured to include a plurality of photoresponsive elements therein, they effectively form a plurality of spot meters disposed in the image plane. The output of the elements may be utilized for very accurately computing photographic exposures. For example, in a single lens reflex such as the camera 30 of FIG. 2, the mirror 38 may be fabricated to include a plurality of photoresponsive elements therein adapted for computation of exposure times for chemical films.

Figure 5:
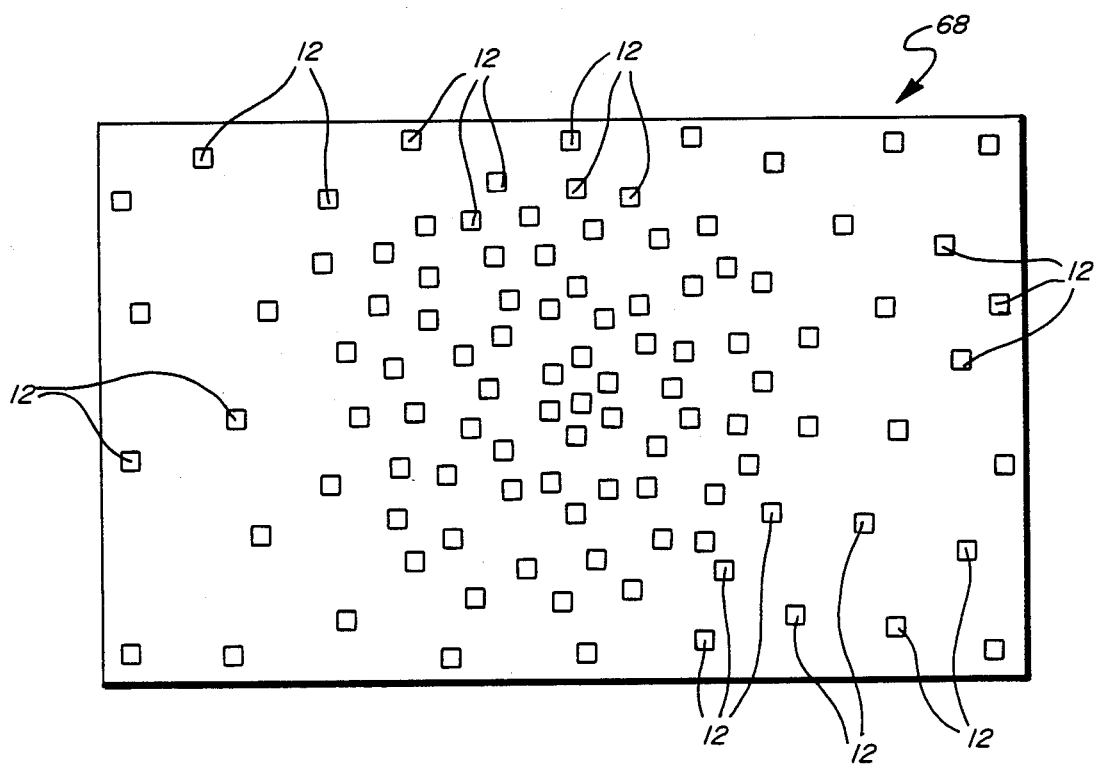
FIG. 5 is a top plan view of a photosensor array-mirror combination structured in accord with the principles of the instant invention and depicted as adapted for control of exposure and focusing parameters in conjunction with a chemical photographic system.

Referring now to FIG. 5 there is shown a mirror 68 includin9 a plurality of photoresponsive elements 12 thereon. This mirror 68 may be directly substituted for the mirror 38 in the single lens reflex camera of FIG. 2 or for the mirror 54 in the folding camera 50 of FIG. 3, and the photoresponsive elements 12, utilized to compute exposure parameters. Although not apparent in the drawing, each of the elements 12, will have appropriate addressing circuitry associated therewith.

It will be noted from an inspection of FIG. 5 that the photoresponsive elements 12 are not equally distributed across the surface of the mirror 68 but increase in density in the direction of the center of the mirror. This is for purposes of providing increased weighting in the center of the image plane. Obviously, other such distributions may be employed. For example, the elements 12 may be equally arrayed across the plane of the mirror 68 and appropriate weighting achieved through electronic manipulation. All of such modifications are within the scope of the present invention.

Obviously, many modifications of the instant invention may be made in keeping with the general principle that a high resolution electronic camera may be manufactured utilizing thin film photosensor arrays. The foregoing drawings and discussion are merely meant to be illustrative of the general Principles of the instant invention and not limitations upon the practice thereof. It is the following claims, including all equivalents, which are meant to define the scope of the instant invention.

What is claimed is:

1. An electronic camera including:
   a thin film photosensor array adapted to read a pattern of information incident thereon and generate a detectable electrical signal corresponding thereto;
   means adapted to optically project a pattern of information corresponding to an object onto said photosensor array;
   means for triggering the reading of the pattern of information projected onto said photosensor array and
   said array including a plurality of small area photoresponsive elements, each of said elements adapted to photogenerate an electrical signal in response to the illumination thereof and including at least one layer of a semiconductor alloy material chosen from the group consisting of: amorphous silicon alloy materials, amorphous germanium alloy materials, and amorphous silicon carbon alloy materials or amorphous silicon germanium alloy materials.

2. A camera as in claim 1, wherein said plurality of photoresponsive elements are chosen from the group consisting essentially of: photodiodes, phototransistors, photoresistors, photovoltaic devices, or combination thereof.

3. An electronic camera as in claim 2, wherein each of said photoresponsive elements is a photodiode which includes two oppositely doped layers of semiconductor material.

4. A camera as in claim 3, wherein each photodiode further includes a layer of substantially intrinsic semiconductor material interposed between said oppositely doped layers so as to form a p-i-n type photodiode.

5. A camera as in claim 1, wherein said thin film photosensor array further includes addressing means for accessing each of the plurality of photoresponsive elements.

6. A camera as in claim 5, wherein said addressing means includes a plurality of electrically conductive lines arranged so as to form an x-y matrix.

7. A camera as in claim 6, wherein said addressing means further includes a current blocking element associated with each photoresponsive element, said blocking element and said address lines cooperating to provide electrical communication with preselected ones of said photoresponsive elements.

8. A camera as in claim 7, wherein said blocking elements are chosen from the group consisting of: diodes, transistors, resistors, threshold switches, relays, or combinations thereof.

9. A camera as in claim 7, wherein each of said blocking elements is a p-i-n type diode.

10. A camera as in claim 1, wherein said thin film photosensor array is fabricated as a rectangular matrix having sides dimensioned to be at least 35 mm.

11. A camera as in claim 10, wherein the image resolution of said photosensor array is at least 20 lines/mm.

12. A camera as in claim 1, wherein said photosensor array is fabricated as a rectangular matrix having sides dimensioned to be at least 5.7 cm on an edge and including at least 1.4 million discrete photoresponsive elements.

13. A camera as in claim 1, wherein said array includes at least two groups of photoresponsive elements, each group sensitive to a different portion of the electromagnetic spectrum, said groups cooperating to provide an electrical signal corresponding to the color values of the image projected thereonto.

14. A camera as in claim 13, wherein each of said groups of photoresponsive elements includes an optical filter for providing said sensitivity to different portions of the electromagnetic spectrum.

15. A camera as in claim 13, wherein each group of photoresponsive elements is fabricated with a photogenerative region formed from a semiconductor material having a band gap optimized to provide said sensitivity to different wavelengths of the electromagnetic spectrum.

16. A camera as in claim 1, wherein said thin film photosensor array is a two dimensional matrix.

17. A camera as in claim 1, wherein said thin film photosensor array is linear.

18. A camera as in claim 1, wherein said optical projecting means includes at least one lens.

19. A camera as in claim 1, wherein said read triggering means comprises mechanical means adapted to initiate the reading of said pattern of information.

20. A camera as in claim 19, wherein said mechanical means includes a shutter.

21. A camera as in claim 1, wherein said read triggering means comprises electrical means adapted to initiate reading or storage of said pattern of information.

22. A camera as in claim 21, wherein said electrical means includes address circuitry for accessing said photosensor array.

23. A camera as in claim 22, wherein at least a portion of said address circuitry is integrated on a single substrate with said photosensor array.

24. A camera as in claim 1, wherein said optical means further includes means for controlling the intensity of said image projected onto the photosensor array.

25. A camera as in claim 1, wherein said photosensor array is detachably mounted in the camera at the focal plane of said optical means.

26. A camera as in claim 1, wherein said photosensor array forms a portion of the back of said camera.

27. A camera as in claim 1, further including a video display terminal adapted to receive the electrical signal corresponding to the projected pattern and provide a visual display thereof.

28. A camera as in claim 1, further including printer means adapted to receive the electrical signal corresponding to the pattern projected onto the photosensor array and provide a hard copy, visual representation thereof.

29. A camera as in claim 1, further including storage means for storing the electrical signal generated by the photosensor array.

30. A camera as in claim 1, further including means for electronically processing the electrical signal generated by the photosensor array.

31. A camera as in claim 1, further including a chemical photographic medium therein, wherein said electrical signal generated by the array controls the exposure of the chemical photographic medium.

* * * * *

Disclaimer 4,788,594.—*Stanford R. Ovshinsky*, Bloomfield Hills; *Lawrence G. Norris*, West Bloomfield, both of Mich. SOLID STATE ELECTRONIC CAMERA INCLUDING THIN FILM MATRIX OF PHOTOSENSORS. Patent dated Nov. 29, 1988. Disclaimer filed Jan. 17, 1989, by the assignee, *Energy Conversion Devices, Inc.*

The term of this patent subsequent to June 23, 2004, has been disclaimed.
[*Official Gazette March 14, 1989.*]